United States Patent
Sirinorakul et al.

(10) Patent No.: US 7,205,180 B1
(45) Date of Patent: Apr. 17, 2007

(54) PROCESS OF FABRICATING SEMICONDUCTOR PACKAGES USING LEADFRAMES ROUGHENED WITH CHEMICAL ETCHANT

(75) Inventors: Saravuth Sirinorakul, Bangna (TH); Arlene V. Layson, Bangkok (TH); Somchai Nondhasitthichai, Bangkok (TH); Yee Heong Chua, Singapore (SG)

(73) Assignee: NS Electronics Bangkok (1993) Ltd., Bangkok (TH)

( * ) Notice: Subject to any disclaimer, the term of this patent is extended or adjusted under 35 U.S.C. 154(b) by 59 days.

(21) Appl. No.: 10/893,087

(22) Filed: Jul. 16, 2004

Related U.S. Application Data

(62) Division of application No. 10/622,346, filed on Jul. 19, 2003, now Pat. No. 7,049,683.

(51) Int. Cl.
*H01L 21/00* (2006.01)
(52) U.S. Cl. ...................... 438/123; 438/622
(58) Field of Classification Search ................ 438/123, 438/622
See application file for complete search history.

(56) References Cited

U.S. PATENT DOCUMENTS

| | | | |
|---|---|---|---|
| 5,013,688 A | 5/1991 | Yamazaki et al. | 437/210 |
| 5,585,195 A | 12/1996 | Shimada | 428/548 |
| 5,722,161 A | 3/1998 | Marrs | |
| 5,800,859 A | 9/1998 | Price et al. | |
| 5,847,455 A * | 12/1998 | Manteghi | 257/737 |
| 5,869,130 A | 2/1999 | Ferrier | |
| 6,143,981 A | 11/2000 | Glenn | 174/52.4 |
| 6,221,696 B1 | 4/2001 | Crema et al. | |
| 6,451,448 B1 | 9/2002 | Kanda et al. | 428/612 |
| 6,583,500 B1 | 6/2003 | Abbott et al. | 257/666 |
| 6,777,800 B2 | 8/2004 | Madrid et al. | 257/690 |
| 6,870,244 B2 | 3/2005 | Yamashita et al. | 257/668 |
| 2003/0001260 A1 | 1/2003 | Azuma | 257/731 |
| 2003/0150109 A1 | 8/2003 | Magoi | 29/846 |
| 2004/0159918 A1 | 8/2004 | Lee | 257/670 |
| 2005/0003586 A1 | 1/2005 | Shimanuki et al. | 438/124 |
| 2006/0145352 A1 | 7/2006 | Soga et al. | 257/772 |

FOREIGN PATENT DOCUMENTS

| | | | |
|---|---|---|---|
| JP | 02066963 A * | 3/1990 | |
| JP | 402066963 | 3/1990 | |

* cited by examiner

*Primary Examiner*—Douglas W. Owens
(74) *Attorney, Agent, or Firm*—Silicon Valley Patent Group LLP

(57) ABSTRACT

A semiconductor package contains a metal leadframe that has been specially treated by roughening it with a chemical etchant. The roughening process enhances the adhesion between the leadframe and the molten plastic during the encapsulation of the leadframe and thereby reduces the tendency of the package to separate when exposed to moisture and numerous temperature cycles. In one embodiment, the leadframe made of copper is roughened with a chemical etchant that contains sulfuric acid and hydrogen peroxide.

76 Claims, 11 Drawing Sheets

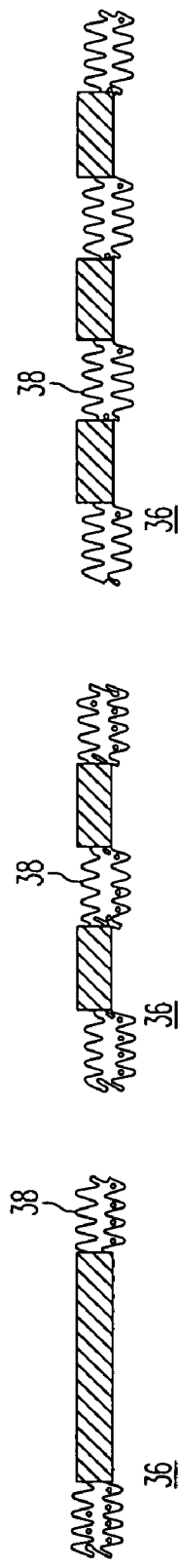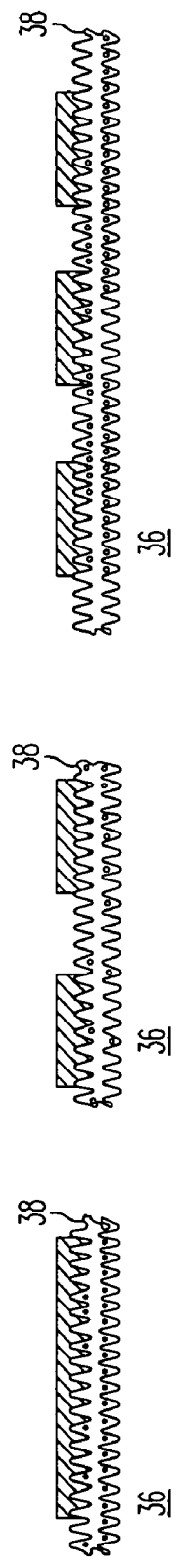

PROCESS OF FABRICATING SEMICONDUCTOR PACKAGES USING LEADFRAMES ROUGHENED WITH CHEMICAL ETCHANT

FIELD OF THE INVENTION

This invention relates to semiconductor packages which contain a semiconductor die, a leadframe for connecting terminals on the die to external circuitry, and an encapsulant for enclosing and protecting the die.

BACKGROUND OF THE INVENTION

Semiconductor dice are normally packaged in a plastic capsule to protect them from physical damage. Connections are made to external circuitry, such as a printed circuit board (PCB), by means of metal pieces, called "lead fingers," that protrude from the capsule and can be soldered or otherwise connected electrically. Alternatively, in a "no lead" package the metal pieces have faces that are flush with the surfaces of the capsule.

FIGS. 1A–1D show four configurations of a semiconductor package. Each package contains a semiconductor die 10, a die-attach pad or "paddle" 12, metal pieces or lead fingers 14, and a plastic capsule 16. Die 10 is attached to attach pad 12 by solder or epoxy. Bonding wires 18, which may be made of gold or aluminum, for example, connect terminal pads on die 10 to metal pieces or lead fingers 14 and to die-attach pad 12. Typically, these connections, often referred to as "wire bonds," are made by thermosonic or ultrasonic welding. Die-attach pad 12 and metal pieces or lead fingers 14 were traditionally made of copper alloy coated with silver or nickel/palladium/gold. The terminal pads on die 10 are traditionally made of aluminum. However, for low-voltage, high frequency semiconductor chips, copper, which has a lower resistivity than aluminum, has become the material of choice. After electrical connections have been made, die 10, die-attach pad 12 and the inner portions of lead fingers 14 are placed in a mold and a molten plastic compound is introduced into the mold to form capsule 16.

FIG. 1A shows a "no lead" package 1 wherein the edges of metal pieces 14 are flush with the side and bottom surfaces of capsule 16. FIG. 11B shows a "gull wing" package 2 wherein lead fingers 14 extend from the opposite sides of capsule 16 and are bent or curved such that their ends are substantially parallel to the bottom of capsule 16. FIG. 1C shows a "dual in-line" package 3 wherein lead fingers 14 extend from the opposite sides of capsule 16 and are bent vertically downward in a directional perpendicular to the bottom of capsule 16. FIG. 1D shows a "J" or "C" lead package 4 that is similar to the dual in-line package 3 except that the ends of lead fingers 14 are bent inward as shown. In an alternative set of packages 5~8, shown in FIGS. 2A–2D, respectively, die-attach pad 12 is exposed at the bottom instead of being completely encased in plastic capsule 16. This can be done, for example, to provide better heat transfer from die 10.

It is highly desirable to make the package as rugged as possible, in particular to ensure that it is able withstand extremes of temperature and humidity and numerous cycles between high and low temperatures. The plastic that is used to manufacture the capsule normally has a thermal-expansion coefficient that is quite different from the thermal-expansion coefficient of the semiconductor chip, leadframe and die-attach material. As a result, as the package cycles between high and low temperatures, stresses are created at the interfaces between the metal and plastic. Over time, this can lead to fractured wire bonds. Moreover, the stress at the metal-plastic interfaces can allow moisture to enter the package. This moisture can corrode the metal components of the package and semiconductor chip. If the package is subjected to freezing temperatures, the moisture can expand and cause separation between the plastic molding compound and the metal. Conversely, if the package is exposed to very high temperatures, the moisture can turn to steam and likewise cause separation or, in extreme cases, cause the package to experience a "popcorn" effect.

Since the lead fingers are often soldered to external circuitry (e.g., a PCB) it is predictable that in many cases the package will be exposed to extremely high temperatures as a result of the soldering process. This situation as worsened recently as a result of the restrictions on the use of lead in the solder that is used to make the connections between the lead fingers of the semiconductor package and the PCB. With solder that contains 15% lead, for example, the lead fingers must be heated to a temperature of approximately 240° C. With a lead-free solder, this temperature increases to approximately 260° C.

Accordingly, there is a real need for a semiconductor package, particularly one that contains a copper alloy leadframe, that is highly impervious to the ingress of moisture.

SUMMARY OF THE INVENTION

A semiconductor package in accordance with this invention contains a leadframe that has been roughened by treating the leadframe with a chemical etchant. In one embodiment of the invention, a leadframe made of copper alloy is roughened using an etchant that contains sulfuric acid ($H_2SO_4$) and hydrogen peroxide ($H_2O_2$). The process may also include a cleaning step to remove contaminants and oxide from the surface of the leadframe and a "predip" step that makes the surface of the copper alloy chemically active. The cleaner may include an acid or a base, and the predip may include an acid and an oxidizer.

The leadframe, which typically contains a die-attach pad and lead fingers, may initially be plated with silver or a metal alloy that is not significantly affected by the roughening process. The plating is generally performed on areas of the leadframe that are to be electrically connected (by wire bonds are otherwise) to other components inside or outside the package.

The roughening of the leadframe causes the surface of the metal to be textured with asperities and, in addition, a coating may be formed on the surface of the leadframe. The roughened surface and the coating enhance the adhesion between the leadframe and the molten plastic during the encapsulation process. This enhanced adhesion reduces the tendency of the leadframe and plastic to separate as a result of the differing thermal-expansion rates between the metal and the package capsule.

A semiconductor package fabricated in accordance with this invention has been shown to be very rugged and to have superior resistance to separation after numerous temperature cycles following a prolonged exposure to moisture.

BRIEF DESCRIPTION OF THE DRAWINGS

FIGS. 7A–7C are cross-sectional views of a die-attach pad showing several ways in which the die-attach pad may be plated.

FIGS. 8A–8C are similar views of a die-attach pad which has been roughened before the plating process was performed.

DESCRIPTION OF THE INVENTION

We have found that the problems described above can be greatly reduced by using a chemical etching process to roughen the surface of the leadframe. Roughening the leadframe enhances the adhesion between the metal surface of the leadframe and the molten plastic during the process of encapsulation and reduces the separation that occurs because of thermal expansion and moisture ingress into the package.

Figure 1A:
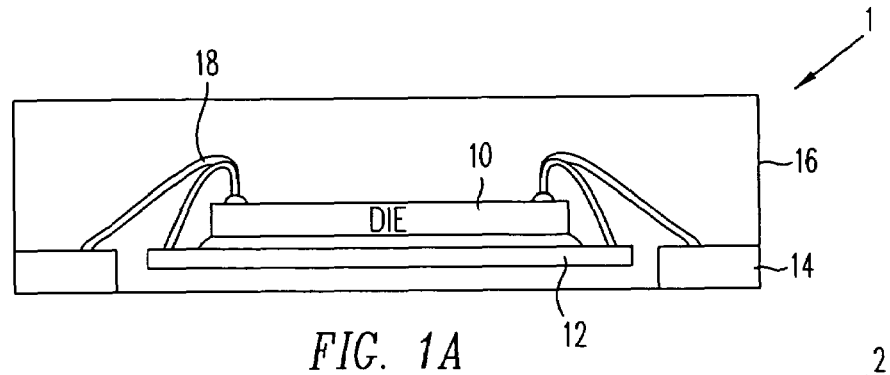
FIGS. 1A–1D illustrate four types of semiconductor packages wherein the semiconductor die is completely encased in the capsule.
Figure 1B:
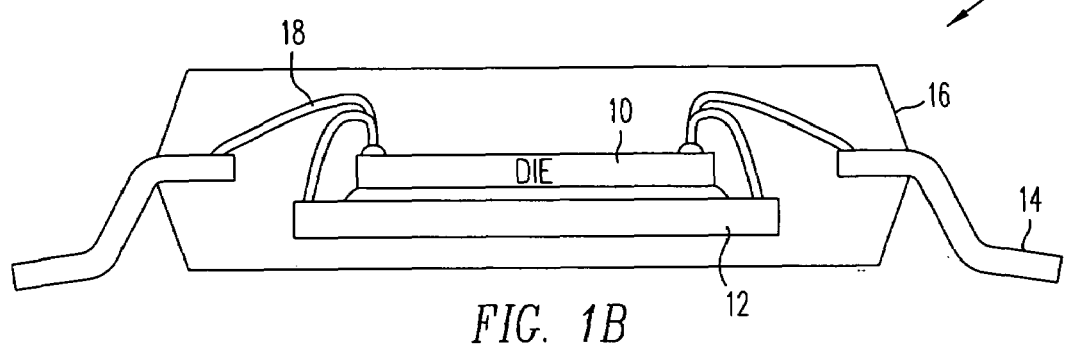
Figure 1C:
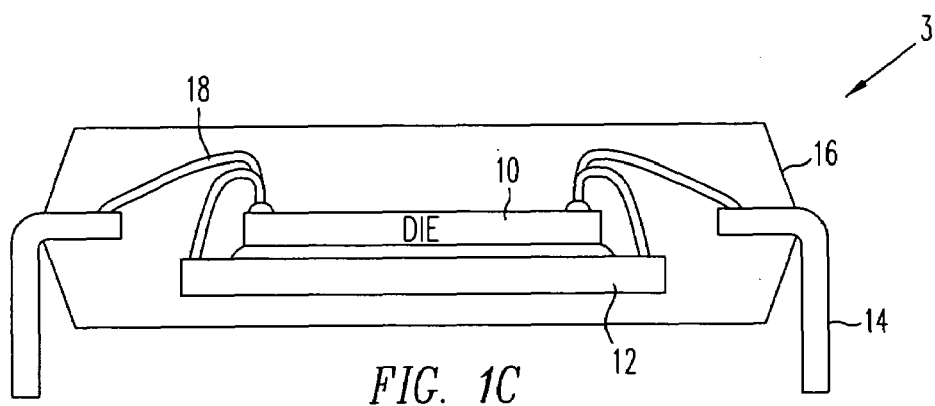
Figure 1D:
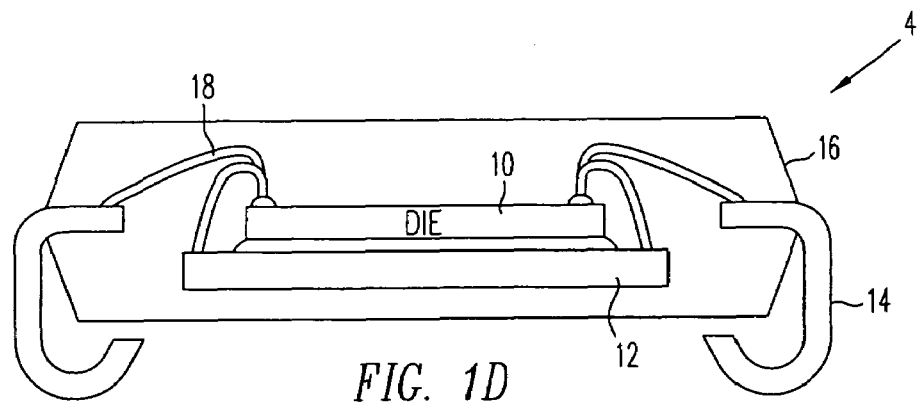
Figure 2A:
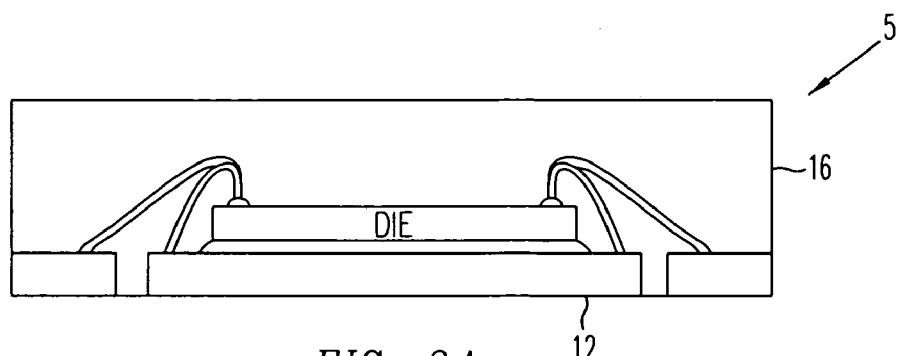
FIGS. 2A–2D illustrate the same semiconductor packages with the semiconductor die-attach pad exposed.
Figure 2B:
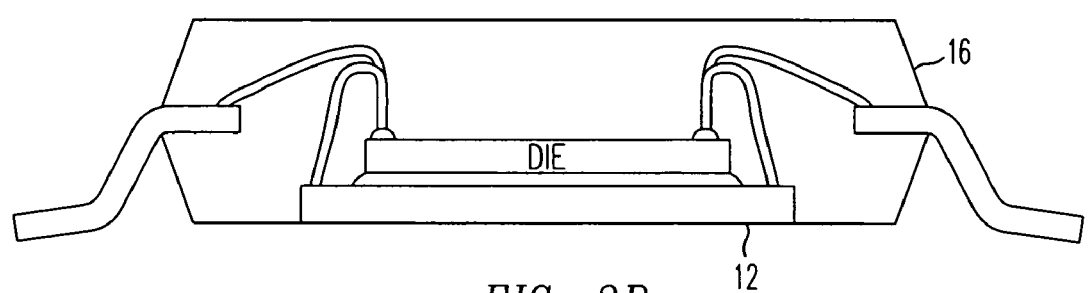
Figure 2C:
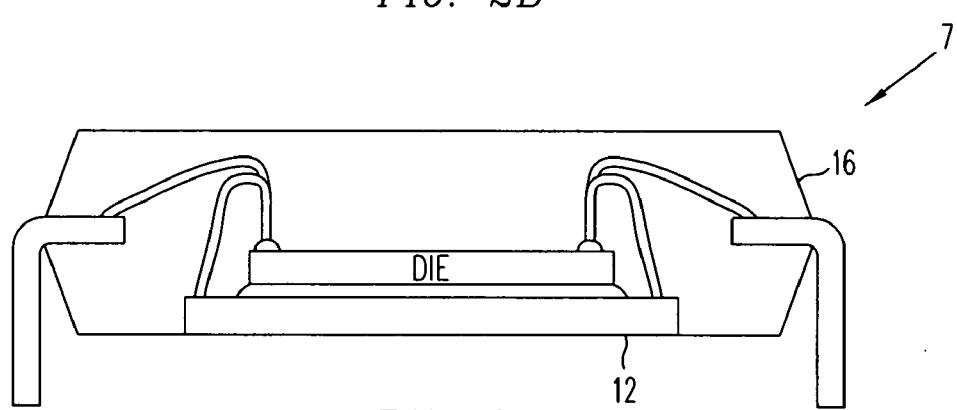
Figure 2D:
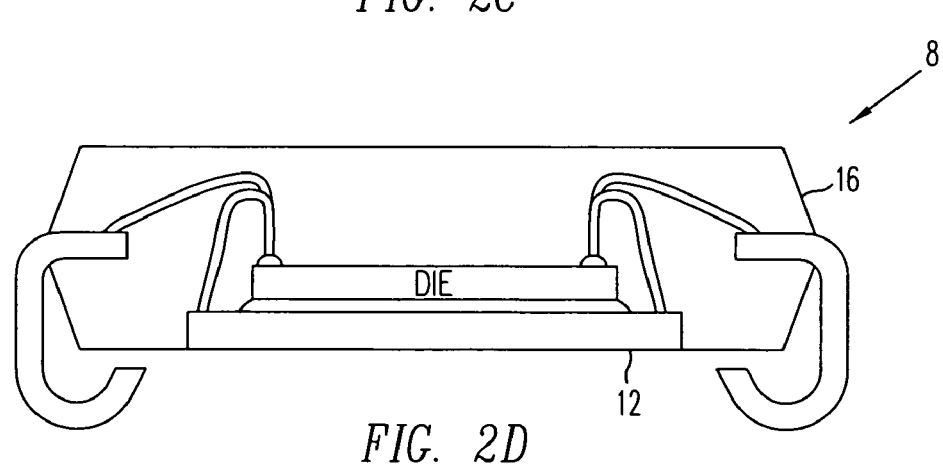
Figure 3A:
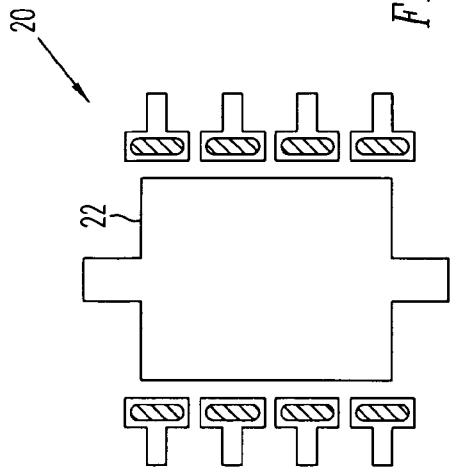
FIGS. 3A–3H are top views of a dual side package showing several patterns in which the leadframe can be plated.
Figure 3B:
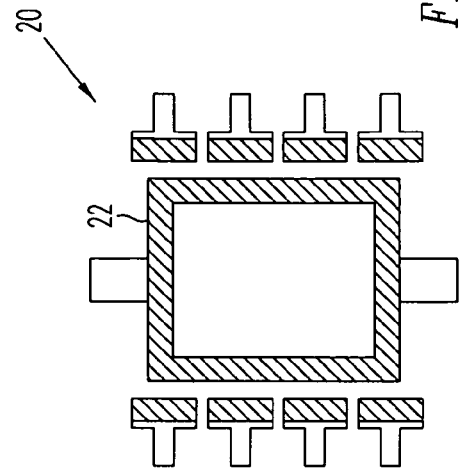
Figure 3C:
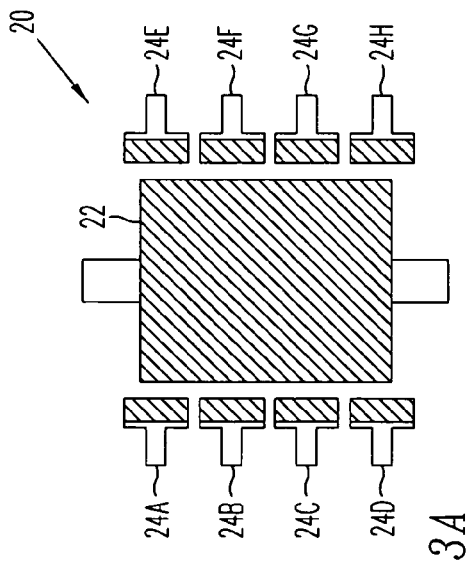
Figure 3D:
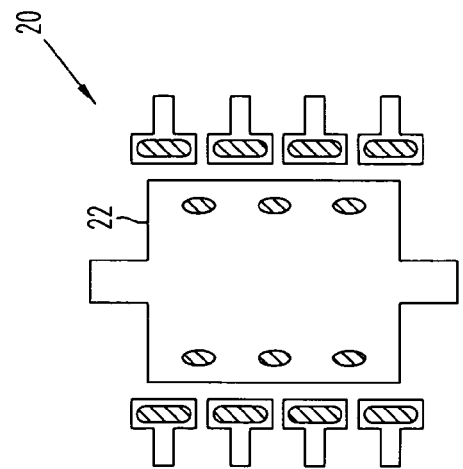
Figure 3E:
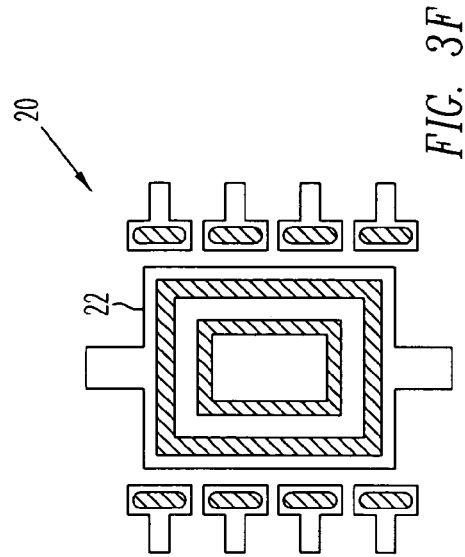
Figure 3F:
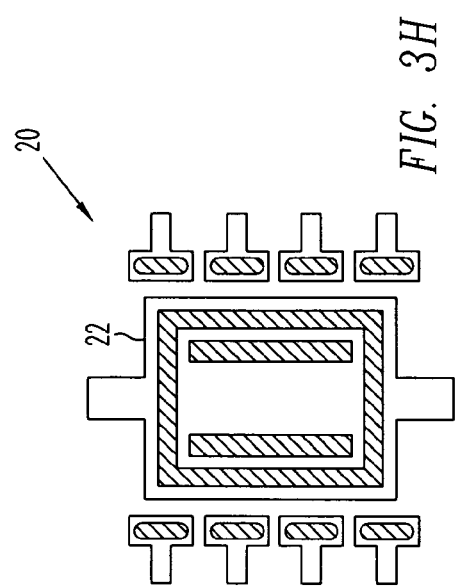
Figure 3G:
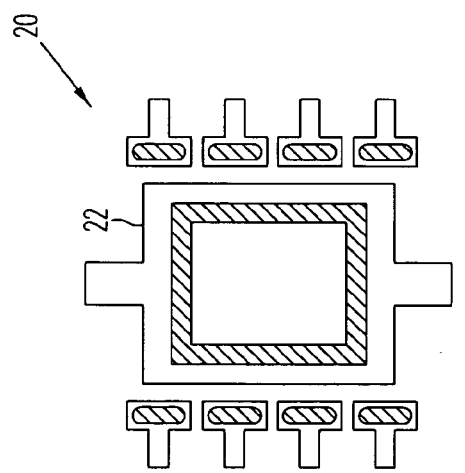
Figure 3H:
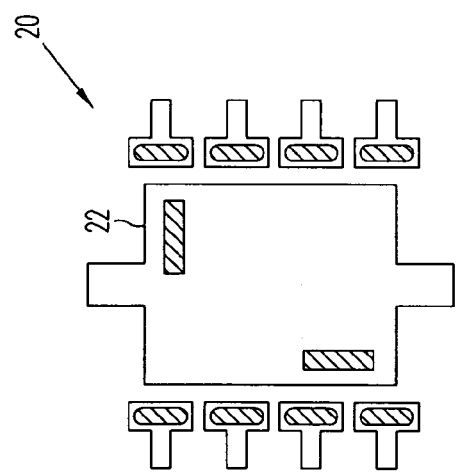
Figure 4A:
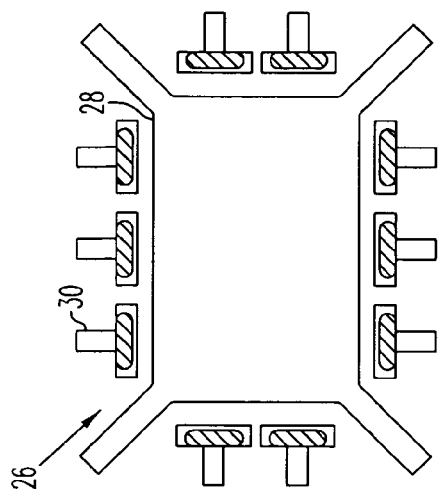
FIGS. 4A–4L are similar views of a quad side package showing various plating patterns.
Figure 4B:
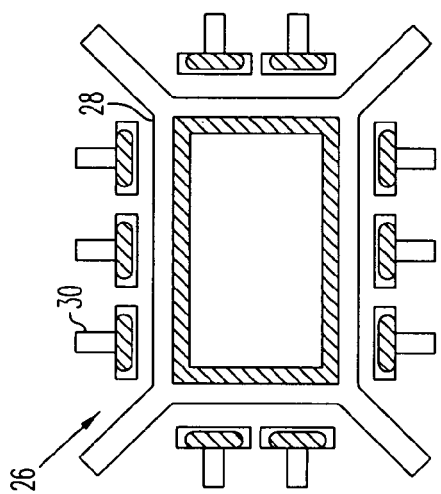
Figure 4C:
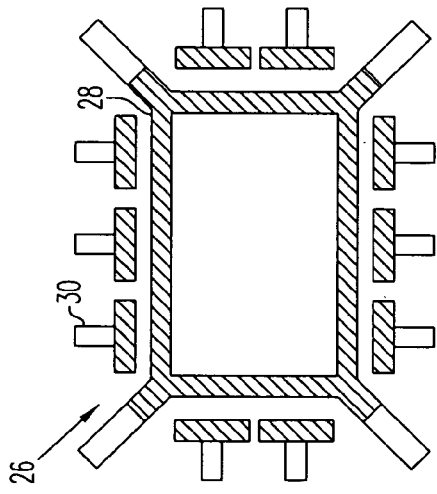
Figure 4D:
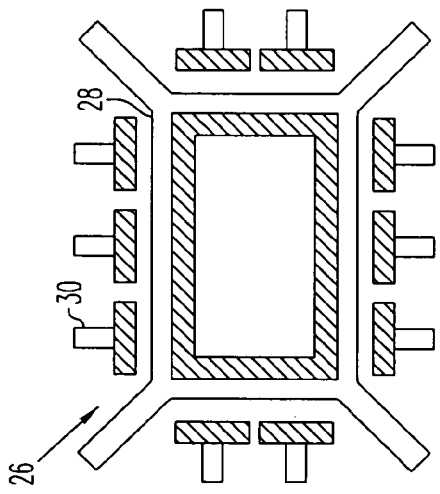
Figure 4E:
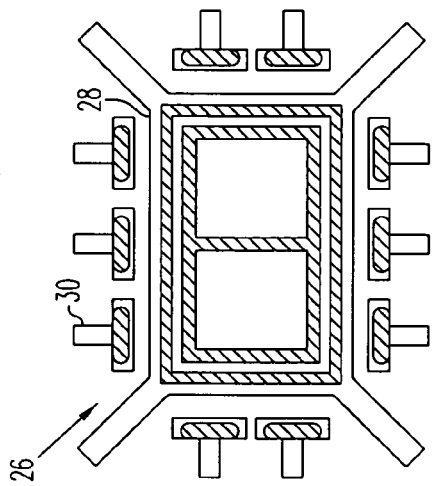
Figure 4F:
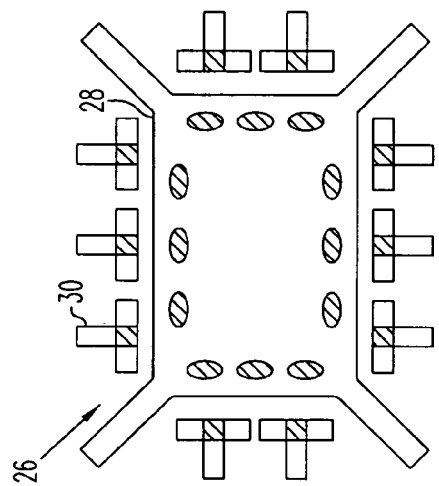
Figure 4G:
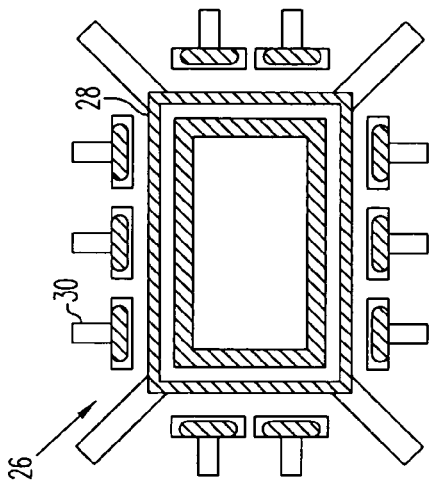
Figure 4H:
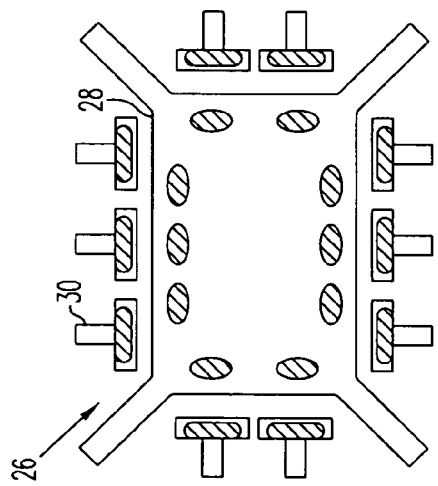
Figure 4I:
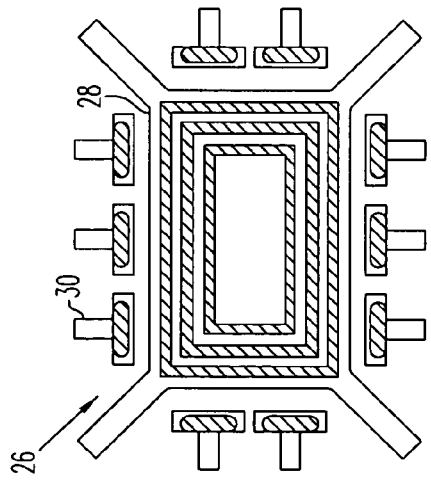
Figure 4J:
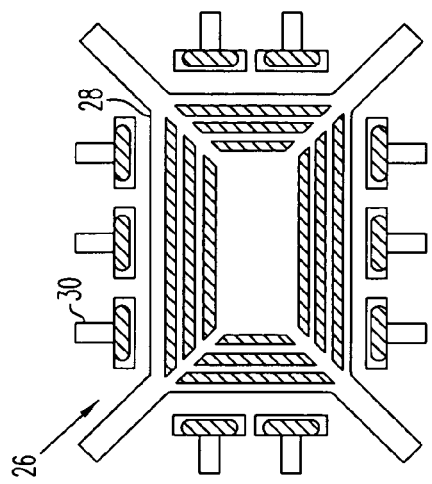
Figure 4K:
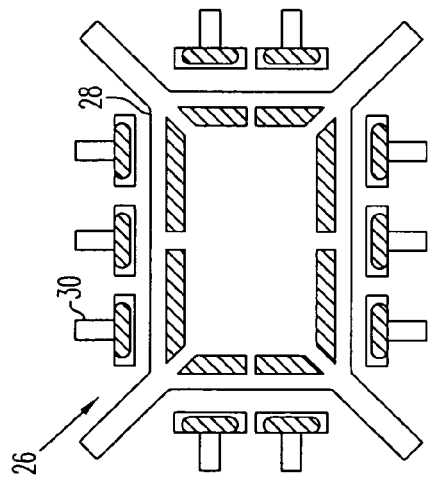
Figure 4L:
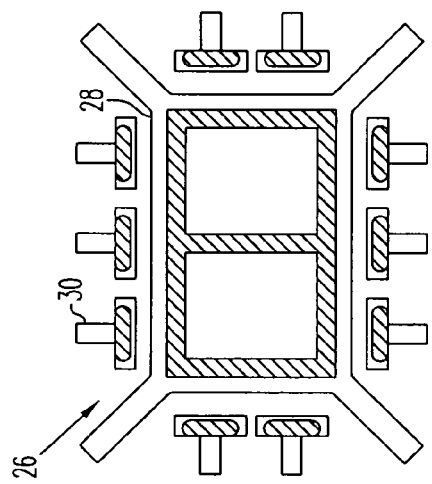
Figure 6A:
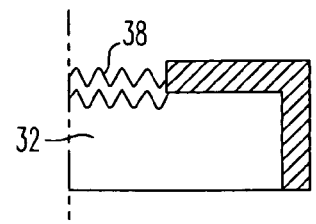
FIGS. 6A–6E are similar to FIGS. 5A–5E except that the bottom of the lead finger or die-attach pad is not roughened.
Figure 6B:
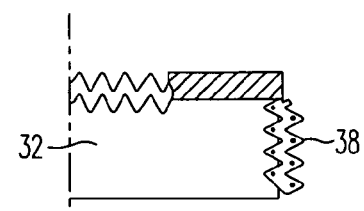
Figure 6C:
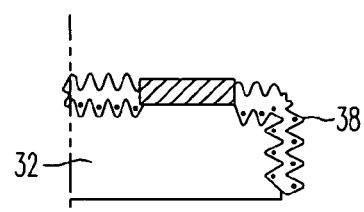

Copper alloy leadframes are normally plated with silver (Ag) or an alloy in order to facilitate the bonding of wires to the leadframe. Alloys that can be used as alternative plating materials include Ni/Au, Ni/Pd, Ni/Pd/Au, and Ni/Pd/Au alloys. The plating covers the areas of the lead fingers or die-attach pad where electrical connections are to be made to other components, typically by wire bonding. FIGS. 3A–3H are top views of a dual side package 20 having a die-attach pad 22 and lead fingers (or metal contacts if the package is unleaded) 24A–24H, with the semiconductor die omitted to show several patterns in which the plating can be performed. In each drawing, the plated areas are hatched; the clear areas are roughened in accordance with this invention. In FIG. 3A, shows a "normal" configuration, wherein substantially all of die-attach pad 22 and the bonding areas of lead fingers 24A–24H are plated. In FIG. 3B, die-attach pad 22 is unplated and lead fingers 24A–24H are "spot" plated. In FIG. 3C, both die-attach pad 22 and lead fingers 24A–24H are "spot" plated. In FIG. 3D, a ring is plated at the perimeter of die-attach pad 22 and substantially-all of the bonding areas of lead fingers 24 are plated. In FIG. 3E, a ring is plated just inside the perimeter of die-attach pad 22 and lead fingers 24A–24H are "spot" plated. In FIG. 3F, a double-ring is plated on die-attach pad 22 and lead fingers 24A–24H are "spot" plated. In FIG. 3G, specific areas of die-attach pad 22 are plated and lead fingers 24A–24H are "spot" plated. In FIG. 3H, die-attach pad 22 is plated with a ring and specific areas, and lead fingers 24A–24H are "spot" plated.

FIGS. 4A–4L are similar views of a quad side package 26 containing a die-attach pad 28 and lead fingers 30, showing various plating patterns that can be formed, including spots, double rings, partially plated strips and multiple rings. The hatched areas are plated; the clear areas are roughened.

Figure 5A:
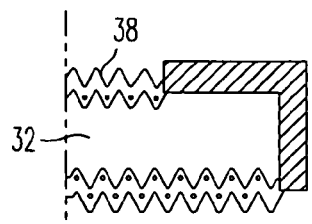
FIGS. 5A–5E are cross-sectional views taken at a transverse cross section of a lead finger or die-attach pad, showing several ways in which the lead finger or die-attach pad may be plated.
Figure 5B:
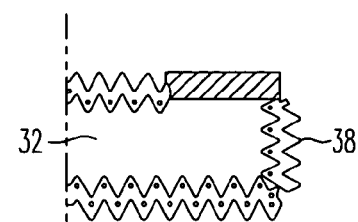
Figure 5C:
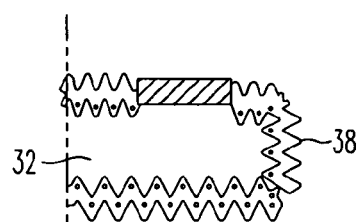
Figure 5D:
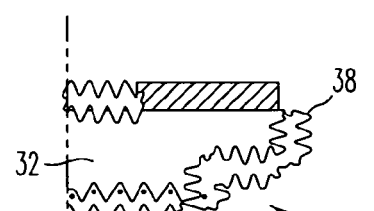
Figure 6D:
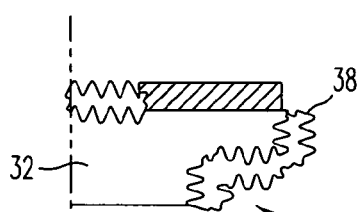
Figure 5E:
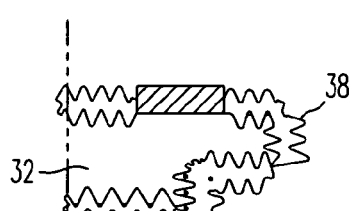
Figure 6E:
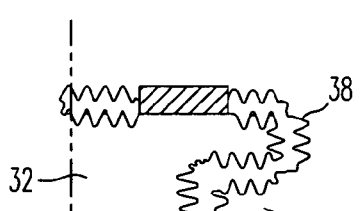

FIGS. 5A–5E are cross-sectional views taken at a cross section of a lead finger or die-attach pad 32, showing several ways in which the lead finger and/or die-attach pad may be plated (hatched) and roughened (jagged line). In each drawing the left side represents the lead finger at the side of the semiconductor package or the centerline of die-attach pad 22. In FIGS. 5D and 5E, lead finger or die-attach pad 32 has a recessed area 34, which is half-etched to provide a secure locking mechanism with the epoxy molding compound. FIGS. 6A–6E are similar to FIGS. 5A–5E except that the bottom of lead finger or die-attach pad 32 is not roughened. Also shown in FIGS. 5A–5E and 6A–6E is an organo-metallic coating 38 which, as described below, may form on the surface during the etching process.

FIGS. 7A–7C are cross-sectional views of a die-attach pad 36. FIG. 7A shows a single ring or "spot" plated area; FIG. 7B shows a double ring or "spot" plate; and FIG. 7C shows a multiple (more than two) ring or "spot" plate. In FIGS. 7A–7C the areas of die-attach pad 36 underneath the plated areas are not roughened. FIGS. 8A–8C are similar views of die-attach pad 36 except that die-attach pad 36 has been roughened before the plating process takes place. As indicated, the plating material (e.g., silver) fills the crevasses caused by the roughening process and the top surfaces of the plated areas are essentially smooth. Also shown in FIGS. 7A–7C and 8A–8C is an organo-metallic coating 38 which, as described below, may form on the surface during the etching process.

The various plating patterns shown in FIGS. 3A–3F, 4A–4L, 5A–5E, 6A–6E, 7A–7C and 8A–8C can be formed by first depositing and patterning a photoresist mask layer on the leadframe, immersing the leadframe in a metal ion-containing solution to plate the areas that are not covered by the photoresist and then removing the photoresist mask. This process is well known in the art and hence will not be described here.

Figure 9:
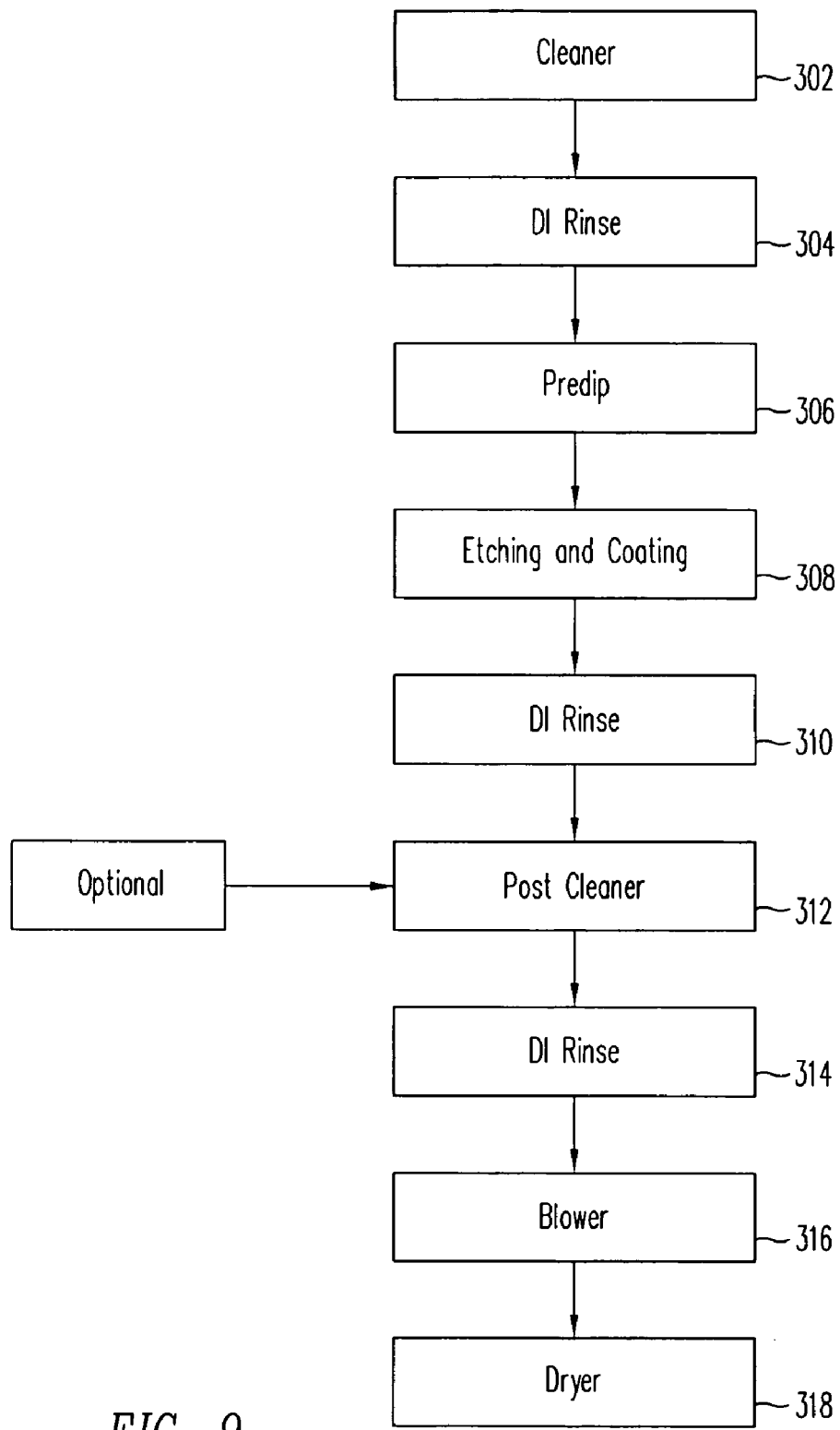
FIG. 9 is a flow chart showing the steps of a roughening process in accordance with this invention.

FIG. 9 is a flow chart showing the steps of a process that can be used to roughen the surfaces of a leadframe. As stated above, the process described is suitable for roughening a copper alloy leadframe, but leadframes made of aluminum or other metals may likewise be roughened by chemical etching in accordance with this invention.

Before the process begins, the leadframes may be partially plated with silver or another metal or alloy in a desired pattern as described above. Alternatively, the leadframes may be roughened first and then plated.

The process described in FIG. 9 is preferably run in a chemical treatment machine in which the leadframes are suspended by clips from a conveyer belt, which moves the leadframes sequentially through the various chemical baths and other process steps. The leadframes can be arranged in "panels" each of which contains a two-dimensional array of leadframes, and the panels can be connected together in "strips." In one embodiment nine leadframes are contained in a panel (3×3), and four panels connected in series make up a strip. The chemicals in the baths flow downward over the surfaces of the leadframes.

Referring to FIG. 9, the copper alloy leadframes are initially immersed in a cleaner to remove any oils, anti-tarnish coatings or other chemicals or any oxide present on the surface of the leadframes (step 302). The cleaner can be an acid or alkaline chemical, for example, 95–97% technical grade sulfuric acid ($H_2SO_4$), which is 15% (±3%) by volume sulfuric acid.

Next, the leadframes are immersed in a "predip" chemical (step 306). This makes the surface of the copper leadframes chemically active and removes any residue of the cleaner that was not removed by the DI water to protect the chemical etchant in the next step from contamination. The predip chemical may be an aqueous solution containing 2% (±0.2%) by volume MULTIBOND 100® chemical and 2% (±0.2%) by volume MULTIBOND C-50® chemical. MULTIBOND 100B® and C-50® chemicals are manufactured by MacDermid Inc., of Singapore. MULTIBOND 100® chemical is an organic and inorganic mixture which contains 5–10% by weight sulfuric acid. MULTIBOND 50-C.® chemical is an oxidizer which contains 40–50% by weight hydrogen peroxide ($H_2O_2$). The predip chemical is heated to about 24° C. (±3° C.). The immersion time can be from 1 to 3 minutes (e.g., 2 minutes). Alternatively, hydrogen persulfate could be used as an oxidizer.

The roughening and coating are then carried out by immersing the leadframes in a etchant/coating material (step 308). The etchant/coating material can be an aqueous solution of 10% by volume MULTIBOND 100A® chemical, 5–8% by volume MULTIBOND 100B® chemical, 2.7–3.5% by volume MULTIBOND C-50® chemical, and 4.5–5.0% by volume sulfuric acid ($H_2SO_4$), contained in a single bath. MULTIBOND 100A® chemical is manufactured by MacDermid Inc., of Singapore. MULTIBOND 100A® chemical is an inorganic and organic mixture which contains 0–3% sulfuric acid by weight. The compositions of MULTIBOND 100B® and C-50® chemicals are stated above. This step etches and roughens the surface of the copper alloy leadframes and simultaneously covers the surface with an organo-metallic brown coating. FIGS. 5A–5E, 6A–6E, 7A–7C, 8A–8C and show an organo-metallic coating 38 covering the roughened surface. The etchant is heated to about 38° C. The immersion time can be from 0.5 to 1.5 minutes (e.g., 1.0 minute). The MULTIBOND® chemicals also contain a corrosion inhibitor, a water soluble polymer, and halide ion producing chemicals. The corrosion inhibitor can be one of the triazoles, benzotriazoles, imidazoles, benzimidazoles, tetrazoles, or a mixture thereof. The water soluble polymer can be one of the ethylene oxide or ethylene oxide-polypropylene oxide copolymers or polyethylene glycols, polypropylene glycols or polyvinyl alcohols, or a mixture thereof. The halide ion producing chemicals can be a sodium chloride or potassium chloride or one of the oxohalide salts or halide bearing mineral acids.

In addition to the MULTIBOND® chemicals available from MacDermid, the following chemicals may also be used to etch and coat the leadframes: MOLDPREP LF™ chemical, available from Atotech (Thailand) Co., Thailand; ALPHAPREP™ chemical, available from Enthone-OMI (Singapore)Pte. Ltd., Singapore; CO-BRA BOND™ chemical, available from Rockwood Electrochemicals Asia Ltd., Taiwan; and SEALBOND OMB™ chemical, available from Technic Asia-Pacific Pte. Ltd., Singapore. All of these materials contain sulfuric acid or hydrogen peroxide or a mixture thereof.

Alternatively, separate baths can be used for the chemicals that etch and coat the leadframes. For example, the etch bath could contain sulfuric acid and the coating bath could contain a mixture of sulfuric acid, hydrogen peroxide and an organic chemical such as benzotriazole. Preferably, the leadframes are rinsed with DI water between the etching and coating steps.

Next, the leadframes are subjected to a second rinse by immersing them in DI water at ambient temperature (step 310).

Furthermore, in some cases it may be desirable to remove any organic contaminants resulting from the coating that remain on the surface of the active wire bonding area of the leadframes (step 312). In this case the leadframe could be immersed in a chemical solution such as METEX 662™ chemical, MULTIBOND 110® Neutralizer, or STERLING™ PreAssembly Cleaner, available from MacDermid, or MOLDPREP™ Post Dip, available from Atotech (Thailand) Co. METEX 662™ is a solution containing potassium hydroxide. MULTIBOND 110® Neutralizer is a mixture of potassium hydroxide, sodium hydroxide and sodium metasilicate. STERLING™ PreAssembly Cleaner is a mixture of hydroxyacetic acid citric acid and butyl carbitol. MOLDPREP™ Post Dip is a mixture of sodium hydroxide and ethylenediamine. This "post-clean" step is optional.

The leadframes are then subjected to a third DI water rinse by spraying or immersion to remove any remaining chemicals (step 314). Both of these steps are carried out at ambient temperature.

The leadframes are then air-blown to remove some of the remaining DI water (step 316) and then heated to about 100° C. to remove the remaining DI water (318).

At the conclusion of the roughening process, the copper surfaces of the leadframes are roughened and have a light brown to brown color.

Following the roughening process, the semiconductor die is attached to the die-attach pad, the wire bonds are completed, and the assembly is encapsulated in a plastic capsule. The encapsulation is accomplished by positioning the leadframes in a mold cavity and injecting a heated molten molding compound into the mold cavity under pressure. The molding compound is then allowed to cure, and the mold is removed, leaving the cured molding compound at least partially surrounding the leadframe and die. Separation may occur at any location where the molding compound is in contact with the leadframe, e.g., on the top surface of the DAP or the lead fingers, on the vertical surfaces of DAP or the lead fingers, or on the bottom surface of the DAP in embodiments where the mold compound is underneath the DAP. The molding compound may be polymer or other epoxy material such as the Sumitomo G600 series, G770 series, EME 7730 series or the Hitachi CEL 9200 series, CEL 9220, CEL 9840 series, etc.

Often a plurality of leadframes are connected together by tie bars in a two-dimensional array, and the leadframes in the array are encapsulated in the plastic molding compound at the same time. After the leadframes have been encapsulated, the individual packages are separated by sawing through the tie bars and the molding compound (a process sometimes referred to as "singulation").

Other etchant/coating materials that may be used in the above process are described in U.S. Pat. No. 5,800,859 to Price et al. and U.S. Pat. No. 5,869,130 to Ferrier, both of which are incorporated herein by reference. Both of these patents describe ways of preventing delamination of the layers in a multi-layer printed circuit board, a problem that involves different structures, different materials, different manufacturing processes, different magnitudes of scale, and different physical principles as compared with the prevention of separation between the molding compound and leadframe in a semiconductor die package.

The roughness values of leadframes roughened according to this invention were measured, using a Mitutoyo SV-500/ SV 3000 series. The following were the results of these measurements:

$Ra$=0.050–0.170 μm $Rc$=0.180–0.700 μm $Rz$=0.400–1.500 μm $Rv$=0.200–0.750 μm where, Ra is the arithmetic mean deviation of the surface profile, i.e., the arithmetic mean of the absolute value of the distance from the mean line to the profile.

Rc is the mean peak-to-valley height, i.e., the difference between the average of all peak heights above the mean line and the average of all valley depths below the mean line.

Rz (ISO/JIS) is the ten-point height of the irregularities, i.e., the difference between the average height of the five highest peaks above the mean line and the average depth of the five deepest valleys below the mean line.

Rv is the maximum profile valley depth, i.e., the mean value of the maximum profile valley depths in the evaluation length.

Leadframes with roughness values within the above ranges were found not to experience separation when formed into semiconductor packages and subjected to the moisture and temperature tests described below. Within these ranges, different degrees of roughening can be obtained by varying the process conditions. For example, in two samples representing a higher degree of roughness and a lower degree of roughness, the values in μm were as shown in Table 1.

TABLE 1

|    | Higher Roughening | Lower Roughening |
|----|-------------------|------------------|
| Ra | 0.114 to 0.155    | 0.100 to 0.133   |
| Rc | 0.441 to 0.603    | 0.391 to 0.558   |
| Rz | 0.892 to 1.238    | 0.796 to 1.289   |
| Rv | 0.417 to 0.653    | 0.384 to 0.542   |

To obtain the higher roughening, the conveyor belt in the chemical treatment machine was run at a speed of 0.31 meter/minute; to obtain the lower roughening the conveyor belt was run at a speed of 0.43 meter/minute.

To evaluate the efficacy of the roughening process, a group of Thin Quad Flat Non-lead (TQFN) leadless-type packages were tested. The first test included control lots that contained three types of packages having a standard untreated copper alloy leadframe (Cu L/F) and three types of packages that contained specially treated leadframes in accordance with this invention (identified as STL™). The leadframes tested are described in Table 2:

TABLE 2

| Package | No. of Packages Sampled for Stress Test | Package Size (mm) | No. of Leads | Die Size (mils) | DAP Size (mils) | STL™ (Treated)/ Cu L/F (Untreated) |
|---------|------|------|----|--------------|---------------|---------------|
| 28L TQFN | 88 | 5 × 5 | 28 | 46 × 100 | 138 × 138 | Cu L/F (control lot) |
| 48L TQFN | 88 | 7 × 7 | 48 | 130 × 160 | 228 × 228 | Cu L/F (control lot) |
| 48L TQFN | 88 | 8 × 6 | 48 | 125 × 178 | 268 × 189 | Cu L/F (control lot) |
| 32L TQFN | 88 | 5 × 5 | 32 | 70 × 70 | 146 × 146 | STL™ |
| 48L TQFN | 88 | 7 × 7 | 48 | 120 × 120 | 228 × 228 | STL™ |
| 48L TQFN | 88 | 8 × 6 | 48 | 112 × 126 | 268 × 189 | STL™ |

The packages were preconditioned by subjecting them to a Moisture Sensitivity Level (MSL) Test, at Level-1 condition, in accordance with Jedec Standard J-STD-020B. Forty-four (44) units of each type of package were subjected to the MSL-1 precondition, which included a C-mode scanning acoustic microscope (CSAM) test, 10 temperature cycles from −65° C. to +150° C., a bake at 125° C., a moisture soak at 85° C. and 85% relative humidity for 168 hours in a temperature and humidity chamber, three passes of convection reflow at 240° C., and a second CSAM test.

Twenty-two units (22) of each type of package were subjected to a failure analysis, which included an external visual inspection, a second CSAM test, decapsulation of the molding compound, and an examination of the bonds with a scanning electron microscope (SEM). A second group 22 units of each type of package were subjected to 500 temperature cycles from −65° C. to +150° C., and then to a similar failure analysis, i.e., an external visual inspection, a third CSAM test, decapsulation of the molding compound, and an examination of the bonds with an SEM.

The remaining 44 packages in each lot were subjected to a similar MSL-1 precondition, except that in this case the three passes of convection reflow were at 260° C. instead of 240° C. Otherwise, the tests were identical to those performed on the first group of packages, i.e., the packages were split into two groups of 22 units, one group was subjected to the same failure analysis, and the other group was subjected to 500 temperature cycles from −65° C. to +150° C. and then the same failure analysis.

Figure 10:
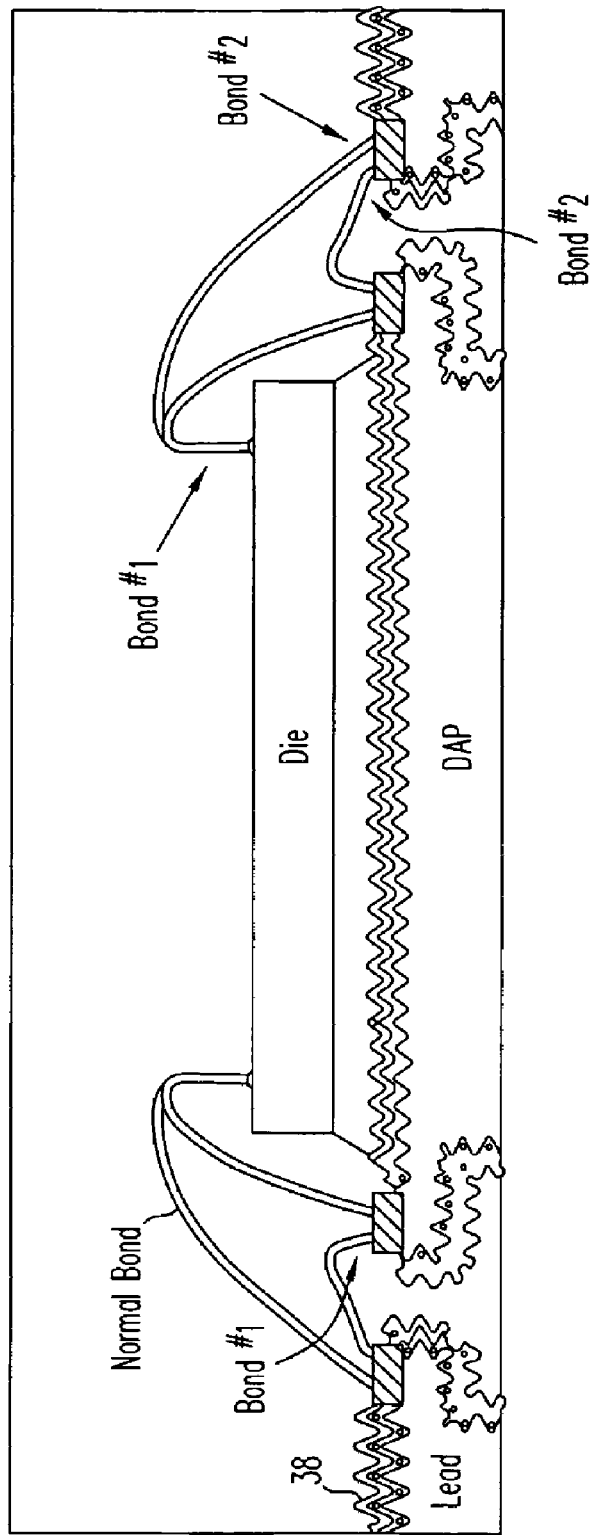
FIG. 10 is a cross-sectional view of a package, showing the nomenclature for designating the bonding wires and the bonds.

FIG. 10 shows the nomenclature that is used to identify the bonds and bonding wires. As indicated, the bonding wire between the chip and the die attach pad (DAP) is referred to as the "ground bonding wire," the bonding wire between the chip and a lead finger is referred to as a "normal bonding wire," and the bonding wire between a lead finger and the DAP is referred to as a "down bonding wire." For the "normal" and "ground" bonding wires, the bonds to the chip are referred as the "first" bonds and the other bonds are referred as the "second" bonds. For the "down" bonding wire, the bond to the DAP is referred to as the "first" bond and the bond to a lead is referred to as the "second" bond.

In the control lots (packages containing untreated leadframes) there was no separation on the surface of the die, but there was separation on the die attach pad (DAP), and the SEM examination showed cracking at the second bond of both the ground and down bonding wires in all three lots. In addition, there was slight separation on the lead fingers on the 7×7 mm and 8×6 mm packages.

In the STL™ packages, there was no separation at the surfaces of the die, the DAP or the lead fingers, and no cracking of any of the bonds.

To confirm these results, second group of packages was also tested, all of which contained leadframes that were specially treated in accordance with this invention. These packages were made up of three lots of a 28L TQFN package and six lots of a 48L TQFN package. Table 3 contains a description of some of the characteristics of each package.

TABLE 3

| Package | No. of Lots | Package Size (mm) | No. of Leads | Die Size (mils) | DAP Size (mils) |
|---------|-------------|-------------------|--------------|-----------------|-----------------|
| 28L TQFN | 3 | 5 × 5 | 28 | 89 × 87 | 138 × 138 |
| 48L TQFN | 6 | 7 × 7 | 48 | 142 × 166 | 228 × 228 |

Initially 15 packages were taken from each lot and subjected to a stress test that included a CSAM test, three passes at a reflow temperature of 240° C., a visual inspection, a second CSAM test, and decapsulation of the plastic capsule to check the bond integrity. In these tests there was no evidence of separation or bond cracking.

Next 52 packages of each type were selected. These packages were preconditioned by subjecting them to an MSL-1 condition. The MSL-1 precondition included a CSAM test, 10 temperature cycles from −65° C. to +150° C., a bake at 125° C., a moisture soak at 85° C. and 85% relative humidity for 168 hours in a temperature and humidity chamber, three passes of convection reflow at 240° C., a visual inspection, and a second CSAM test. After the three passes of convection reflow at 240° C., there was no evidence of separation in either the 28L TQFN or 48L TQFN packages.

Half (26) of the packages from each group were then subjected to 500 temperature cycles from −65° C. to +150° C. and 11 of the packages in each group were chemically decapsulated to remove the plastic capsule. There was no evidence of separation in either the 28L TQFN or 48L TQFN packages. There was no evidence of bond cracking in any of the packages.

A second group of 52 packages of each type were subjected to the same series of tests except that the convection reflow temperature was 260° C. There was no evidence of separation or bond cracking in any of these packages.

Thus a semiconductor package that contains a specially treated leadframe according to this invention is rugged and far less likely to experience separation and wire defects than similar packages fabricated with untreated leadframes.

While specific embodiments of this invention have been described, many alternative embodiments within the broad scope of this invention will be apparent to those of skill in the art.

We claim:

1. A process of fabricating a plurality of semiconductor die packages comprising:
    fabricating an array of leadframes, said leadframes connected together by a plurality of tie bars, each of the leadframes in the array comprising a die attach pad and a plurality of leads;
    exposing the leadframes to a cleaner so as to remove any oils, anti-tarnish coatings or oxide of the surface of the leadframes;
    following said exposure to a cleaner, exposing at least a portion of each of said leadframes to a chemical etchant so as to roughen a surface of said leadframes;
    attaching a semiconductor die to each of said die attach pads;
    covering a portion of said leadframes and the semiconductor dice with a molten plastic to encapsulate said dice and said leadframes; and
    separating said leadframes to form said semiconductor die packages.

2. The process of claim 1 wherein said leadframes comprise copper.

3. The process of claim 2 wherein said chemical etchant comprises sulfuric acid.

4. The process of claim 2 wherein said chemical etchant comprises hydrogen peroxide.

5. The process of claim 4 wherein said chemical etchant comprises hydrogen peroxide in a concentration in the range of 1.8% to 3.5% by volume.

6. The process of claim 2 further comprising treating said leadframes with one or more chemicals selected from the group consisting of potassium hydroxide, a mixture of sodium hydroxide and sodium metasilicate, a mixture of hydroxyacetic acid, citric acid and butyl carbitol, and a mixture of sodium hydroxide and ethylenediamine.

7. The process of claim 6 comprising treating said leadframes with a corrosion inhibitor.

8. The process of claim 7 wherein said corrosion inhibitor comprises one or more chemicals selected from the group consisting of the triazoles, the bezotriazoles, the imidazoles, the benzimidazoles, and the tetrazoles.

9. The process of claim 1 wherein the cleaner comprises an acid or alkaline chemical.

10. The process of claim 9 wherein the cleaner comprises sulfuric acid.

11. The process of claim 10 wherein the cleaner is technical grade sulfuric acid.

12. A process of fabricating a plurality of semiconductor die packages comprising:
    fabricating an array of leadframes, said leadframes connected together by a plurality of tie bars, each of the leadframes in the array comprising a die attach pad and a plurality of leads;
    exposing at least a portion of each of said leadframes to a chemical etchant so as to roughen a surface of said leadframes;
    attaching a semiconductor die to each of said die attach pads;
    covering a portion of said leadframes and the semiconductor dice with a molten plastic to encapsulate said dice and said leadframes; and
separating said leadframes to form said semiconductor die packages, said process further comprising:
    a pre-dip step, which renders the surface of said leadframes more chemically active; and
    an etching/coating step.

13. The process of claim 12 wherein said pre-dip step comprises exposing said leadframes to a solution containing an acid and an oxidizing agent.

14. The process of claim 13 wherein said oxidizing agent comprises a chemical selected from the group consisting of hydrogen peroxide and hydrogen persulfate.

15. The process of claim 12 wherein said oxidizing agent comprises hydrogen peroxide in a concentration in the range of 1.8% to 3.5% by volume.

16. The process of claim 12 wherein said etching/coating step comprises exposing said leadframes to a solution containing an acid and an oxidizing agent.

17. A process of fabricating a semiconductor die package comprising:
    providing a leadframe, the leadframe comprising a plurality of leads;

exposing the leadframe to a cleaner so as to remove any oils, anti-tarnish coatings or oxide of the surface of the leadframe;

following said exposure to a cleaner, roughening at least a portion of a top surface of the leadframe by exposing the top surface of the leadframe to a chemical etchant;

providing a semiconductor die;

positioning the semiconductor die and the leadframe in a cavity of a mold;

injecting a heated molten molding compound into the cavity, after the injection the molten molding compound being in contact with at least a top surface and a lateral surface of the die and at least the top surface of the leadframe;

allowing the molding compound to cure; and removing the leadframe, the die and the molding compound from the mold.

18. The process of claim 17 wherein the chemical etchant comprises sulfuric acid.

19. The process of claim 18 wherein the chemical etchant is at a temperature of about 38° C. during the roughening.

20. The process of claim 19 wherein the roughening lasts from about 0.5 to about 1.5 minutes.

21. The process of claim 17 wherein the leadframe comprises a bottom surface and wherein the roughening includes roughening the bottom surface by exposing the bottom surface of the lead frame to the chemical etchant.

22. The process of claim 17 wherein the leadframe comprises a bottom surface and wherein the roughening does not include exposing the bottom surface of the lead frame to the chemical etchant.

23. The process of claim 17 comprising plating a metal onto at least a portion of the top surface of the leadframe prior to the roughening.

24. The process of claim 17 comprising plating a metal onto at least a portion of the top surface of the leadframe after the roughening.

25. A process of fabricating a semiconductor die package comprising:

providing a leadframe, the leadframe comprising a plurality of leads;

roughening at least a top surface of the leadframe by exposing the top surface of the leadframe to a chemical etchant;

providing a semiconductor die;

positioning the semiconductor die and the leadframe in a cavity of a mold;

injecting a heated molten molding compound into the cavity, after the injection the molten molding compound being in contact with at least a top surface and a lateral surface of the die and at least the top surface of the leadframe;

allowing the molding compound to cure; and removing the leadframe, the die and the molding compound from the mold, wherein the chemical etchant comprises a corrosion inhibitor.

26. The process of claim 25 wherein the corrosion inhibitor comprises at least one material selected from the group consisting of the triazoles, the benzotriazoles, the imidazoles, the benzimidazoles, and the tetrazoles.

27. A process of fabricating a semiconductor die package comprising:

providing a leadframe, the leadframe comprising a plurality of leads;

roughening at least a top surface of the leadframe by exposing the top surface of the leadframe to a chemical etchant;

Providing a semiconductor die;

positioning the semiconductor die and the leadframe in a cavity of a mold;

injecting a heated molten molding compound into the cavity, after the injection the molten molding compound being in contact with at least a top surface and a lateral surface of the die and at least the top surface of the leadframe;

allowing the molding compound to cure; and removing the leadframe, the die and the molding compound from the mold, wherein the chemical etchant comprises a water-soluble polymer.

28. The process of claim 27 wherein the water-soluble polymer comprises at least one material selected from the group consisting of the ethylene oxide polymers, the ethylene oxide-polypropylene oxide copolymers, the polyethylene glycols, the polypropylene glycols, and the polyvinyl alcohols.

29. A process of fabricating a semiconductor die package comprising:

providing a leadframe, the leadframe comprising a plurality of leads;

roughening at least a top surface of the leadframe by exposing the top surface of the leadframe to a chemical etchant;

providing a semiconductor die;

positioning the semiconductor die and the leadframe in a cavity of a mold;

injecting a heated molten molding compound into the cavity, after the injection the molten molding compound being in contact with at least a top surface and a lateral surface of the die and at least the top surface of the leadframe;

allowing the molding compound to cure; and removing the leadframe, the die and the molding compound from the mold, wherein the chemical etchant comprises a halide ion producing chemical.

30. The process of claim 29 wherein the halide ion producing chemical comprises at least one material selected from the group consisting of sodium chloride, potassium chloride, the oxohalide salts, and the halide bearing mineral acids.

31. A process of fabricating a semiconductor die package comprising:

providing a leadframe, the leadframe comprising a plurality of leads;

roughening at least a top surface of the leadframe by exposing the top surface of the leadframe to a chemical etchant;

providing a semiconductor die;

positioning the semiconductor die and the leadframe in a cavity of a mold;

injecting a heated molten molding compound into the cavity, after the injection the molten molding compound being in contact with at least a top surface and a lateral surface of the die and at least the top surface of the leadframe;

allowing the molding compound to cure; and removing the leadframe, the die and the molding compound from the mold, the process further comprising treating the leadframe with a cleaner prior to the roughening, the cleaner comprising an acid or alkaline chemical.

32. The process of claim 31 further comprising rinsing the leadframe in DI water after treating the leadframe with the cleaner and before the roughening.

33. The process of claim 32 further comprising treating the leadframe with a pre-dip chemical after the treating the leadframe in DI water and before the roughening, the pre-dip chemical comprising sulfuric acid and hydrogen peroxide.

34. The process of claim 33 further comprising rinsing the leadframe with DI water again after the roughening.

35. The process of claim 34 comprising, after rinsing the leadframe with DI water again, treating the leadframe with at least one material selected from the group consisting of potassium hydroxide, sodium hydroxide, sodium metasilicate, hydroxyacetic acid, citric acid, butyl carbitol and ethylenediamine.

36. The process of claim 35 comprising rinsing the leadframe with DI water a third time after treating the leadframe with at least one material selected from the group consisting of potassium hydroxide, sodium hydroxide, sodium metasilicate, hydroxyacetic acid, citric acid, butyl carbitol and ethylenediamine.

37. The process of claim 36 comprising blowing air onto the leadframe after rinsing the leadframe with DI water a third time.

38. The process of claim 37 comprising heating the leadframe to about 100° after blowing air onto the leadframe.

39. A process of fabricating a semiconductor die package comprising:
providing a leadframe, the leadframe comprising a plurality of leads;
roughening at least a top surface of the leadframe by exposing the top surface of the leadframe to a chemical etchant;
providing a semiconductor die;
positioning the semiconductor die and the leadframe in a cavity of a mold;
injecting a heated molten molding compound into the cavity, after the injection the molten molding compound being in contact with at least a top surface and a lateral surface of the die and at least the top surface of the leadframe;
allowing the molding compound to cure; and
removing the leadframe, the die and the molding compound from the mold,
wherein the chemical etchant comprises benzotriazole or another organic chemical.

40. The process of claim 39 wherein the roughening produces an organo-metallic coating on the top surface of the leadframe.

41. The process of claim 40 wherein the chemical etchant is at a temperature of about 38° C. during the roughening.

42. The process of claim 41 wherein the roughening lasts from about 0.5 to about 1.5 minutes.

43. The process of claim 39 wherein the chemical etchant comprises a corrosion inhibitor.

44. The process of claim 43 wherein the corrosion inhibitor comprises at least one material selected from the group consisting of the triazoles, the benzotriazoles, the imidazoles, the benzimidazoles, and the tetrazoles.

45. The process of claim 39 wherein the chemical etchant comprises a water-soluble polymer.

46. The process of claim 45 wherein the water-soluble polymer comprises at least one material selected from the group consisting of the ethylene oxide polymers, the ethylene oxide-polypropylene oxide copolymers, the polyethylene glycols, the polypropylene glycols, and the polyvinyl alcohols.

47. The process of claim 39 wherein the chemical etchant comprises a halide ion producing chemical.

48. The process of claim 47 wherein the halide ion producing chemical comprises at least one material selected from the group consisting of sodium chloride, potassium chloride, the oxohalide salts, and the halide bearing mineral acids.

49. The process of claim 39 further comprising treating the leadframe with a cleaner prior to the roughening, the cleaner comprising an acid or alkaline chemical.

50. The process of claim 49 further comprising rinsing the leadframe in DI water after treating the leadframe with the cleaner and before the roughening.

51. The process of claim 49 further comprising treating the leadframe with a pre-dip chemical after the treating the leadframe in DI water and before the roughening, the pre-dip chemical comprising sulfuric acid and hydrogen peroxide.

52. The process of claim 39 further comprising rinsing the leadframe with DI water again after the roughening.

53. The process of claim 52 comprising, after rinsing the leadframe with DI water again, treating the leadframe with at least one material selected from the group consisting of potassium hydroxide, sodium hydroxide, sodium metasilicate, hydroxyacetic acid, citric acid, butyl carbitol and ethylenediamine.

54. The process of claim 53 comprising rinsing the leadframe with DI water a third time after treating the leadframe with at least one material selected from the group consisting of potassium hydroxide, sodium hydroxide, sodium metasilicate, hydroxyacetic acid, citric acid, butyl carbitol and ethylenediamine.

55. The process of claim 54 comprising blowing air onto the leadframe after rinsing the leadframe with DI water a third time.

56. The process of claim 55 comprising heating the leadframe to about 100° after blowing air onto the leadframe.

57. A process of fabricating a semiconductor die package comprising:
providing a leadframe, the leadframe comprising a plurality of leads;
roughening at least a top surface of the leadframe by exposing the top surface of the leadframe to a chemical etchant;
providing a semiconductor die;
positioning the semiconductor die and the leadframe in a cavity of a mold;
injecting a heated molten molding compound into the cavity, after the injection the molten molding compound being in contact with at least a top surface and a lateral surface of the die and at least the top surface of the leadframe;
allowing the molding compound to cure; and
removing the leadframe, the die and the molding compound from the mold,
the process further comprising, after the roughening with a chemical etchant has been completed, treating the leadframe with benzotriazole or another organic chemical, the treating causing an organometallic coating to form on the surface of the leadframe.

58. The process of claim 57 wherein the chemical etchant comprises sulfuric acid.

59. The process of claim 58 wherein the chemical etchant is at a temperature of about 38° C. during the roughening.

60. The process of claim 59 wherein the roughening lasts from about 0.5 to about 1.5 minutes.

61. The process of claim 57 wherein the chemical etchant comprises a corrosion inhibitor.

62. The process of claim 61 wherein the corrosion inhibitor comprises a material selected from the group consisting of the triazoles, benzotriazoles, imidazoles, benzimidazoles, tetrazoles, or a mixture thereof.

63. The process of claim 57 wherein the chemical etchant comprises a water-soluble polymer.

64. The process of claim 63 wherein the water-soluble polymer comprises a material selected from the group consisting of the ethylene oxide or ethylene oxide-polypropylene oxide copolymers or polyethylene glycols, polypropylene glycols or polyvinyl alcohols, or a mixture thereof.

65. The process of claim 57 wherein the chemical etchant comprises a halide ion producing chemical.

66. The process of claim 65 wherein the halide ion producing chemical comprises a material selected from the group consisting of sodium chloride, potassium chloride, the oxohalide salts, and the halide bearing mineral acids.

67. The process of claim 57 further comprising treating the leadframe with a cleaner prior to the roughening, the cleaner comprising an acid or alkaline chemical.

68. The process of claim 67 further comprising rinsing the leadframe in DI water after treating the leadframe with the cleaner and before the roughening.

69. The process of claim 68 further comprising treating the leadframe with a pre-dip chemical after the treating the leadframe in DI water and before the roughening, the pre-dip chemical comprising sulfuric acid and hydrogen peroxide.

70. The process of claim 57 further comprising rinsing the leadframe with DI water again after the roughening and before treating the leadframe with benzotriazole or another organic chemical.

71. The process of claim 70 comprising, after treating the leadframe with benzotriazole or another organic chemical, treating the leadframe with one or more materials selected from the group consisting of potassium hydroxide, sodium hydroxide, sodium metasilicate, hydroxyacetic acid, citric acid, butyl carbitol and ethylenediamine.

72. The process of claim 71 comprising rinsing the leadframe with DI water a third time after treating the leadframe with one or more materials selected from the group consisting of potassium hydroxide, sodium hydroxide, sodium metasilicate, hydroxyacetic acid, citric acid, butyl carbitol and ethylenediamine.

73. The process of claim 72 comprising blowing air onto the leadframe after rinsing the leadframe with DI water a third time.

74. The process of claim 73 comprising heating the leadframe to about 100° after blowing air onto the leadframe.

75. A process of fabricating a semiconductor die package comprising:
   providing a leadframe, the leadframe comprising a plurality of leads;
   roughening at least a top surface of the leadframe by exposing the top surface of the leadframe to a chemical etchant;
   providing a semiconductor die;
   positioning the semiconductor die and the leadframe in a cavity of a mold;
   injecting a heated molten molding compound into the cavity, after the injection the molten molding compound being in contact with at least a top surface and a lateral surface of the die and at least the top surface of the leadframe;
   allowing the molding compound to cure; and
   removing the leadframe, the die and the molding compound from the mold,
   wherein the leadframe comprises a lateral edge, the roughening including roughening the lateral edge by exposing the lateral edge to the chemical etchant.

76. The process of claim 75 wherein the lateral edge includes a recessed area to provide a locking mechanism with the molding compound, the roughening including roughening the recessed area by exposing the recessed area to the chemical etchant.

* * * * *